United States Patent [19]
Jimenez

[11] Patent Number: 5,336,920
[45] Date of Patent: Aug. 9, 1994

[54] BURIED AVALANCHE DIODE HAVING LATERALLY ADJACENT SEMICONDUCTOR LAYERS

[75] Inventor: Jean Jimenez, Voiron, France

[73] Assignee: SGS-Thomson Microelectronics S.A., Saint-Genis Pouilly, France

[21] Appl. No.: 32,500

[22] Filed: Mar. 17, 1993

[30] Foreign Application Priority Data

Mar. 20, 1992 [FR] France .................. 92 03762

[51] Int. Cl.$^5$ .................................. H01L 29/90
[52] U.S. Cl. ........................ 257/481; 257/551; 257/603
[58] Field of Search ............... 257/481, 551, 603, 605, 257/606, 199

[56] References Cited

U.S. PATENT DOCUMENTS 4,872,039 10/1989 Stabile .................. 257/551

OTHER PUBLICATIONS

Patent Abstracts of Japan, vol. 7, No. 170 (E-189) Jul. 27, 1983 & JP-A 58 078 452 (Tokyo Shibaura Denki KK) May 12, 1983.
Patent Abstracts of Japan, vol. 8, No. 119 (E-248) Jun. 5, 1984 & JP-A-59 032 177 (Tokyo Shibaura Denki KK) Feb. 21, 1984.
IBM Technical Disclosure Bulletin, vol. 28, No. 8, Jan., 1986, New York, US, pp. 3551-3552, "Gate Dielectric Breakdown Avoidance Utilizing Zener Breakdown of Heavily-Doped Junctions".

Primary Examiner—Rolf Hille
Assistant Examiner—David B. Hardy
Attorney, Agent, or Firm—Wolf, Greenfield & Sacks

[57] ABSTRACT

An avalanche diode structure incorporated in an integrated circuit is embodied by the lateral junction between two adjacent buried layers having opposite conductivity types and a high doping level. This diode includes: a first highly doped buried layer of the same first conductivity type as the integrated circuit substrate; a second highly doped buried layer of the second conductivity type, surrounding the first buried layer and laterally contacting the first layer; and a third low doped buried layer of the second conductivity type disposed beneath the first buried layer and overlapping with respect to the second layer so as to also contact a portion of the second buried layer.

20 Claims, 1 Drawing Sheet

BURIED AVALANCHE DIODE HAVING LATERALLY ADJACENT SEMICONDUCTOR LAYERS

BACKGROUND OF THE INVENTION

1. Field of the Invention

The present invention relates to the manufacturing of integrated circuits and more particularly of BICMOS integrated circuits.

2. Discussion of the Related Art

Integrated circuit manufacturers use various technological processes to manufacture integrated circuits capable of meeting specific requirements. These technological processes are especially characterized by the number of diffusion (or implantation) steps and of masking steps. In a given technology, the manufacturer of integrated circuits desires to be capable of providing the highest possible number of basic components.

In the following description, the BICMOS process as described in European patent application 401,135 filed by the applicant in the name of the same inventor and claiming a priority of Jun. 2, 1989, will be more particularly considered. This process has the advantage of providing complementary MOS transistors and high and low voltage bipolar transistors on a single integrated circuit.

As will be described in relation with FIGS. 1A and 1B, this technological process provides three types of buried layers realized in a silicon substrate before growing an epitaxial layer in which will be formed the MOS and bipolar transistors.

FIG. 1A is a simplified diagram of an intermediate step of this technological process and schematically corresponds to FIG. 4 of the above mentioned patent application.

From the upper surface of a P-type low doped semiconductor substrate 1, have been formed, generally by implantation and annealing steps, N-type highly doped regions 2, N-type low doped regions 3, and P-type highly doped regions 4-1 and 4-2. The highly doped P regions can be realized inside regions 3, as shown by region 4-1.

The state of the device during a subsequent manufacturing step is illustrated in FIG. 1B which schematically corresponds to FIG. 5 of the above mentioned patent application. During this step, an N-type low doped epitaxial layer 5 is grown above the structure of FIG. 1A.

Transistors can be conventionally formed in the epitaxial layer 5 from the upper surface of the chip. Similarly, those skilled in the art know how to form avalanche diodes into layer 5 by using diffused regions from the upper surface. In this case, it is known that impurity diffusions from the surface or polarizations of surface isolating layers generate a drift of the breakdown voltage of the junctions during the lifetime of the diode. Additionally, in known devices, to reach a relatively high threshold voltage (12-20 volts) several diodes in series are used.

SUMMARY OF THE INVENTION

An object of the present invention is to provide an avalanche diode in accordance with the above technology.

Another object of the invention is to provide such an avalanche diode that is easy to manufacture, has a simple structure, and has breakdown voltage characteristics that are well determined and reliable in time.

A further object of the invention is to provide such an avalanche diode that is suitably isolated from the other components provided in the chip.

To achieve this object, the invention provides an avalanche diode structure incorporated in an integrated circuit having a lateral junction between two adjacent buried layers having opposite conductivity types and a high doping level.

According to an embodiment of the invention, the diode includes a first highly doped buried layer of the same first conductivity type as the substrate of the integrated circuit; a second highly doped buried layer of the second conductivity type, surrounding the first buried layer and laterally contacting the first layer; and a third low doped buried layer of the second conductivity type disposed beneath the first buried layer and extending beyond the first layer so as to also contact a portion of the second buried layer. The diode is coated with a low doped epitaxial layer of the second conductivity type. First and second highly doped and deeply diffused regions, of first and second conductivity types, respectively contact first and second buried layers from the upper surface of the integrated circuit. The upper surfaces of the first and second deeply diffused regions are provided with contacts.

The foregoing and other objects, features, aspects and advantages of the invention will become apparent from the following detailed description of the present invention which should be read in conjunction with the accompanying drawings.

The drawings are schematic and not drawn to scale. In addition, the shapes, and more particularly the lateral shapes, of the various layers are represented for the sake of simplicity with right angles whereas, in practice, as is well known by those skilled in the art, the diffusion and annealing steps form rounded shapes.

DETAILED DESCRIPTION

Figure 1A:
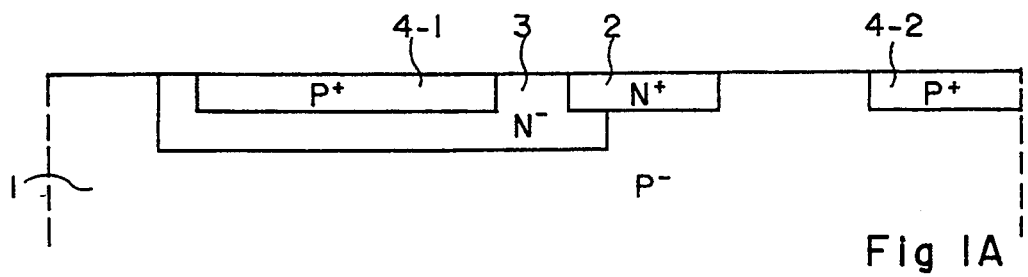
FIGS. 1A and 1B, above described, disclose intermediate manufacturing steps of an integrated circuit in a BICMOS technology.
Figure 1B:
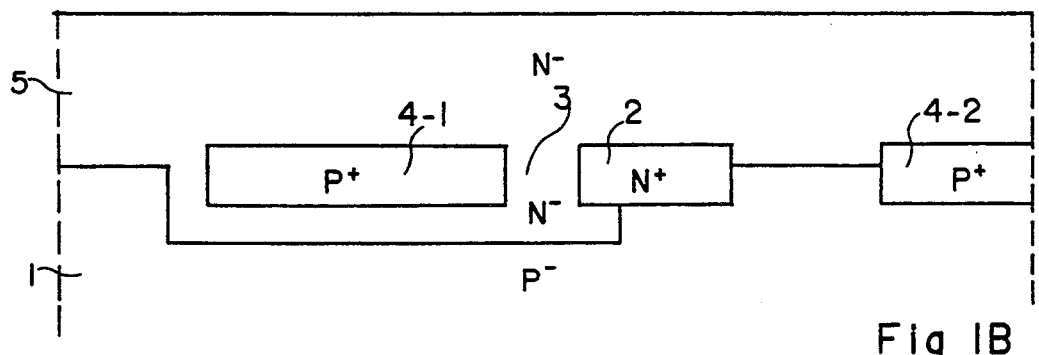
Figure 2:
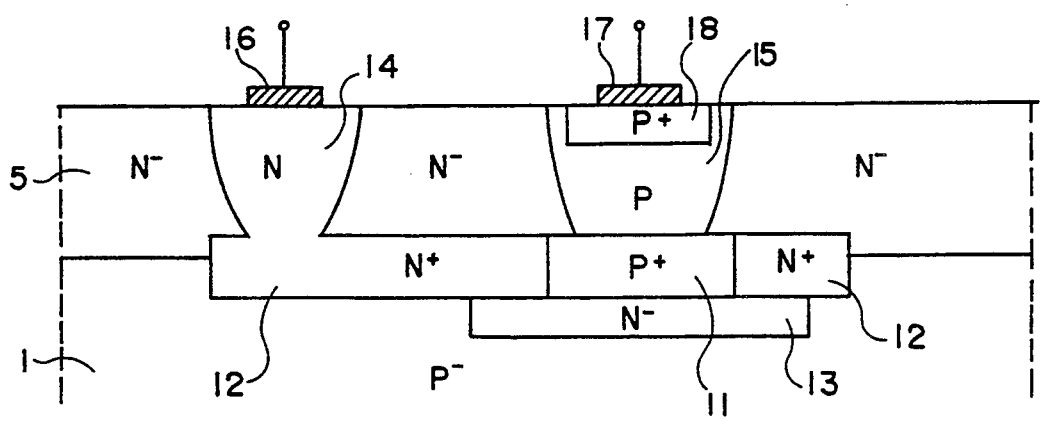
FIG. 2 is a schematic cross-sectional view of an avalanche diode according to an embodiment of the invention.

As shown in FIG. 2, the invention uses a structure obtained with the technology illustrated in FIGS. 1A and 1B, comprising on a substrate 1 an epitaxial layer 5. A highly doped (P+) P-type buried region 11 is surrounded by a highly doped (N+) N-type buried region 12 so that there is a continuous lateral contact between regions 11 and 12. A low doped (N−) N-type buried region 13 is disposed beneath region 11 and also extends beneath a portion of region 12. This N− region 13, which is at the voltage of N+ region 12, insulates the P+ region 11 from the substrate. With the conventional doping levels used for buried layers P+ and N+, the avalanche voltage of N+P+ junction between regions 12 and 11, when this junction is reverse biased, is approximately 10-20 volts. Such an avalanche diode having such a breakdown voltage is particularly useful in practice to serve as a protection diode against overvoltages on the supply line, when the supply voltage is normally 12 volts.

It will be noted that, for the operation of the circuits usually embodied in the considered technology, the accuracy of the doping level of the N+ and P+ regions is not critical. In fact, the N+ region is always much more highly doped than the P+ region. By modulating the doping level of the P+ region, while maintaining the same at a high level, it is possible to adjust the avalanche voltage of the N+P+ junction to a selected value, for example 12 to 16 volts.

In order to provide from the above described N+P+ junction, an avalanche diode connected to external terminals, or to other contacts of the integrated circuit, contacts are established with the junction from the upper surface of the substrate. This can be achieved by deep diffusions, such as an N-type diffused region 14 which extends between the surface of the substrate and region 12, and a P-type deeply diffused region 15 which extends between the surface of the substrate and region 11. Contacts 16 and 17, such as metallizations, can be provided on the upper surface of regions 14 and 15. If the deep diffusions have an insufficient diffusion level at the surface, an overdoped region can be provided beneath the metallization. Such an overdoped P-type region 18 is represented beneath metallization 17.

In an application to provide a protection diode, metallization 16 is connected to the supply terminal and metallization 17 to ground.

Additionally, an advantage of the avalanche diode realized from the buried layers according to the invention is that its breakdown voltage is unlikely to drift during its lifetime, unlike surface diodes.

Of course, the invention is liable of numerous structure modifications and of various applications, which will appear to those skilled in the art.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. An avalanche diode structure incorporated in an integrated circuit, comprising:
    a lateral junction between first and second adjacent buried layers, the first buried layer being of a first conductivity type and the second buried layer being of a second conductivity type, the first and second buried layers each having a high doping level and being of opposite conductivity types;
    wherein the diode structure and the two buried layers each have upper, lower, and lateral surfaces;
    a substrate of the integrated circuit having the first conductivity type;
    a third low doped layer of the second conductivity type disposed against the lower surface of the first buried layer and a portion of the second buried layer;
    wherein the second buried layer is disposed around and against the lateral surfaces of the first buried layer.

2. The avalanche diode structure of claim 1, wherein the diode is coated on its upper surface with a low doped epitaxial layer of the second conductivity type, and
    wherein a first highly doped and deeply diffused region of the first conductivity type contacts the first layer, and a second highly doped and deeply diffused region of the second conductivity type contacts the second layer, both first and second regions contacting from an upper surface of the integrated circuit, wherein upper surfaces of the first and second deeply diffused regions are provided with first and second contacts, respectively.

3. The avalanche diode structure of claim 2, wherein the first conductivity type is P-type and the second conductivity type is N-type.

4. The avalanche diode structure of claim 3, further comprising a highly doped region disposed between at least one of the first and second contacts and the corresponding first and second deeply diffused regions.

5. An avalanche diode structure for an integrated circuit, comprising:
    a first buried layer of a first conductivity type having a first doping level; and
    a second buried layer of a second conductivity type having a second doping level, the second buried layer disposed laterally adjacent to the first buried layer;
    wherein the first doping level and the second doping level is a high doping level;
    wherein the first and second conductivity types are opposite conductivity types;
    and further comprising an integrated circuit substrate of the first conductivity type wherein the avalanche diode structure is disposed in the substrate.

6. The avalanche diode structure of claim 5, wherein the second doping level is greater than the first doping level.

7. The avalanche diode structure of claim 5, wherein the diode structure and the first and second buried layers each have upper, lower, and lateral surfaces;
    the substrate is of the first conductivity type; and
    the second buried layer contacts and laterally encircles the first buried layer so that the lateral surfaces of the first buried layer are substantially free of contact with the substrate.

8. The avalanche diode structure of claim 7, further comprising a third buried layer of the second conductivity type disposed beneath the first buried layer to separate the first buried layer from the substrate wherein the third buried layer also contacts a portion of the second buried layer.

9. The avalanche diode structure of claim 8, further comprising a low doped epitaxial layer of the second conductivity type coating the diode structure on its upper surfaces.

10. The avalanche diode structure of claim 9, further comprising at least one highly doped and deeply diffused region coupling at least one of the first and second buried layers to a surface of the epitaxial layer.

11. The avalanche diode structure of claim 10, wherein a first highly doped and deeply diffused region of the first conductivity type and a second highly doped and deeply diffused region of the second conductivity type respectively couple the first buried layer and the second buried layer to the surface of the epitaxial layer.

12. The avalanche diode structure of claim 11, further comprising metalization contacts disposed on the first and second highly doped and deeply diffused regions at the surface of the epitaxial layer.

13. The avalanche diode structure of claim 12, further comprising a highly doped region disposed between at least one of the metalization contacts and corresponding first and second deeply diffused regions.

14. The avalanche diode structure of claim 13, wherein the first conductivity type is P-type and the second conductivity type is N-type.

15. An avalanche diode structure incorporated in an integrated circuit, comprising:
 a lateral junction between two adjacent buried layers, a first buried layer having a first conductivity type and a second buried layer having a second conductivity type, the two buried layers being of opposite conductivity types and each having a high doping level;
 a third buried layer of the second conductivity type disposed adjacent to the first buried layer;
 a substrate of the integrated circuit;
 wherein the first buried layer is physically separated from the substrate by the second buried layer and the third buried layer.

16. The avalanche diode structure of claim 15, wherein the substrate is of the first conductivity type.

17. The avalanche diode structure of claim 16, wherein the first buried layer is P-type and the second buried layer is N-type, and the first and second buried layers form a P-N junction having an avalanche breakdown voltage.

18. The avalanche diode structure of claim 17, wherein the high doping level of the second layer is greater than the high doping level of the first layer.

19. The avalanche diode structure of claim 17, wherein the avalanche breakdown voltage is adjustable by modulating the high doping level of one of the first and second layers.

20. The avalanche diode structure of claim 19, wherein the avalanche breakdown voltage is adjustable by modulating the high doping level of the first layer.

* * * * *